(12) United States Patent
Zhu et al.

(10) Patent No.: US 12,406,723 B2
(45) Date of Patent: Sep. 2, 2025

(54) VOLTAGE-MODE CROSSBAR CIRCUITS

(71) Applicant: TetraMem Inc., Fremont, CA (US)

(72) Inventors: Hengfang Zhu, Fremont, CA (US); Wenbo Yin, Alameda, CA (US); Miao Hu, San Jose, CA (US)

(73) Assignee: TetraMem Inc., San Jose, CA (US)

( * ) Notice: Subject to any disclaimer, the term of this patent is extended or adjusted under 35 U.S.C. 154(b) by 225 days.

(21) Appl. No.: 18/302,278

(22) Filed: Apr. 18, 2023

(65) Prior Publication Data

US 2024/0355386 A1 Oct. 24, 2024

(51) Int. Cl.
G11C 11/16 (2006.01)
G11C 13/00 (2006.01)

(52) U.S. Cl.
CPC .......... G11C 13/003 (2013.01); G11C 13/004 (2013.01); G11C 2213/79 (2013.01)

(58) Field of Classification Search
CPC . G11C 13/003; G11C 13/004; G11C 2213/79; G11C 2013/0045; G11C 11/1673; G11C 13/0007; G11C 2013/0054; G11C 13/0026; G11C 13/0028; G11C 13/0069
See application file for complete search history.

(56) References Cited

U.S. PATENT DOCUMENTS

| | | | |
|---|---|---|---|
| 2007/0241942 A1 | 10/2007 | Mouttet | |
| 2011/0103145 A1 | 5/2011 | Sarin et al. | |
| 2011/0305063 A1 | 12/2011 | Perner | |
| 2014/0185362 A1* | 7/2014 | Haukness | G11C 13/0097 365/148 |
| 2018/0114569 A1* | 4/2018 | Strachan | G11C 11/54 |
| 2018/0321942 A1 | 11/2018 | Yu et al. | |
| 2020/0143885 A1 | 5/2020 | Kim et al. | |
| 2020/0243126 A1* | 7/2020 | Jacob | G11C 13/003 |
| 2020/0381027 A1 | 12/2020 | Horng et al. | |
| 2024/0379140 A1* | 11/2024 | Zhu | G11C 13/0028 |

OTHER PUBLICATIONS

Weier Wan, et al. "A compute-in-memory chip based on resistive random-access memory", Aug. 18, 2022, pp. 504-532, vol. 208, Nature.
International Searching Authority (ISA)/US, International Search Report for PCT/US2024/025243, mailed Aug. 12, 2024, 2 pages.
International Searching Authority (ISA)/US, Written Opinion for PCT/US2024/025243, mailed Aug. 12, 2024, 5 pages.

* cited by examiner

*Primary Examiner* — Hien N Nguyen
(74) *Attorney, Agent, or Firm* — Jaffery Watson Hamilton & DeSanctis LLP

(57) ABSTRACT

The present disclosure relates to voltage-mode crossbar circuits that may include a plurality of bit lines intersecting with a plurality of word lines, a plurality of cross-point devices, and a plurality of sensing circuits configured to amplify bit line voltages settled on the bit lines in response to an application of input voltages to the cross-point devices via the word lines and generate digital outputs representative of the amplified bit line voltages. Each cross-point device is connected to one of the word lines and one of the bit lines and may include a resistive random-access memory (RRAM) device. Each cross-point device may further be connected to a local select line that may enable a group of cross-point devices connected to one or more bit lines. A cross-point device may be enabled when both a global select line and the local select line connected to the cross-point device are enabled.

20 Claims, 8 Drawing Sheets

500

- 510: Selecting a first plurality of cross-point devices of a crossbar circuit, wherein the first plurality of cross-point devices is connected to one or more first bit lines and one or more first word lines intersecting with the one or more first bit lines

- 520: Programming the conductance of the selected cross-point devices to conductance values corresponding to a weight matrix

- 530: Providing a plurality of input voltages to the first plurality of cross-point devices via the one or more first word lines

- 540: Amplifying, using a plurality of sensing circuits, bit line voltages settled on the one or more first bit lines in response to an application of the plurality of input voltages to the first plurality of cross-point devices

- 550: Generating a plurality of digital outputs based on the amplified bit line voltages

FIG. 5

VOLTAGE-MODE CROSSBAR CIRCUITS

TECHNICAL FIELD

The implementations of the disclosure generally relate to crossbar circuits and, more specifically, to voltage-based crossbar circuits.

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In some embodiments, an apparatus includes a plurality of bit lines intersecting with a plurality of word lines; a plurality of cross-point devices, wherein each of the plurality of the cross-point devices is connected to at least one of the word lines and at least one of the bit lines, and wherein each of the plurality of cross-point devices includes a resistive random-access memory (RRAM) device; and a plurality of sensing circuits configured to: amplify a plurality of bit line voltages settled on the plurality of bit lines in response to an application of a plurality of input voltages to the cross-point devices via the plurality of word lines; and generate a plurality of digital outputs representative of the amplified bit line voltages.

In some embodiments, a first sensing circuit of the plurality of sensing circuits includes a first pre-amplifier that amplifies a first bit line voltage on a first bit line.

In some embodiments, the techniques described herein relate to an apparatus, the first sensing circuit further includes an analog-to-digital converter (ADC) configured to generate a first output voltage based on an output of the first pre-amplifier.

In some embodiments, the apparatus further includes a plurality digital-to-analog converters (DACs) configured to convert one or more binary inputs into the plurality of input voltages.

In some embodiments, a first binary input of the one or more binary inputs includes a plurality of bits.

In some embodiments, the techniques described herein relate to an apparatus, further including: a first local select line connected to a first plurality of cross-point devices; a second local select line connected to a second plurality of cross-point devices, wherein the first plurality of the cross-point devices and the second plurality of the plurality of cross-point devices are connected to one or more first word lines of the plurality of word lines, wherein the first plurality of the cross-point devices is connected to one or more first bit lines of the bit lines, and wherein the second plurality of the cross-point devices is connected to one or more second bit lines of the plurality of bit lines; a first switch connected to the first local select line and a first global select line; and a second switch connected to the second local select line and the first global select line.

In some embodiments, the global select line is parallel to the plurality of word lines.

In some embodiments, the first local select line is connected to the first global select line via the first switch in response to an application of a first enable signal to the first switch.

In some embodiments, the first local select line is disconnected from the first global select line via the first switch in response to an application of a second enable signal to the first switch.

In some embodiments, a third local select line is connected to a third plurality of cross-point devices, wherein the third plurality of cross-point devices is connected to the one or more first bit lines of the plurality of bit lines and a second word line, and wherein a third switch is connected to the third local select line and a second global select line.

In some embodiments, the techniques described herein relate to a method for performing in-memory computing, including: selecting a first plurality of cross-point devices of a crossbar circuit, wherein the first plurality of cross-point devices is connected to one or more first bit lines and one or more first word lines intersecting with the one or more first bit lines; providing a plurality of input voltages to the first plurality of cross-point devices via the one or more first word lines; amplifying, using a plurality of sensing circuits, bit line voltages settled on the one or more first bit lines in response to an application of the plurality of input voltages to the first plurality of cross-point devices; and generating a plurality of digital outputs based on the amplified bit line voltages.

In some embodiments, providing the plurality of input voltages includes generating the plurality of input voltages using a plurality of digital-to-analog converters (DACs).

In some embodiments, the plurality of sensing circuits is disconnected from the one or more bit lines while the plurality of input voltages is provided to the first plurality of cross-point devices via the one or more first word lines.

In some embodiments, generating the plurality of digital outputs based on the amplified bit line voltages includes performing analog-to-digital conversion on the amplified bit line voltages.

In some embodiments, selecting the first plurality of cross-point devices includes: connecting a first local select line to a first global select line, wherein the first plurality of cross-point devices of the crossbar circuit is connected to the first local select line; and applying a select voltage via the first global select line.

In some embodiments, connecting the first local select line to the first global select line includes applying a first enable voltage to a first switch that is connected to the first local select line and the first global select line.

In some embodiments, selecting the first plurality of cross-point devices of the crossbar circuit further includes: disconnecting a second local select line from the global select line, wherein the second local select line is connected to a second plurality of cross-point devices, wherein the second plurality of cross-point devices is connected to the one or more first word lines and one or more second bit lines.

In some embodiments, disconnecting the second local select line from the global select line includes: applying a second enable voltage to a second switch connecting the second local select line and the first global select line.

In some embodiments, selecting the first plurality of cross-point devices of the crossbar circuit includes: activating an array of cross-point devices by connecting each local select line of a plurality of local select lines to one of a plurality of global select lines, wherein the array of cross-point devices includes the first plurality of cross-point devices.

In some embodiments, connecting each local select line of the plurality of local select lines to one of the plurality of global select lines includes applying an enable voltage to a plurality of switches connected to the plurality of local select lines.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIG. 5 is a flowchart of an example method for performing in-memory computing using a crossbar circuit in accordance with some embodiments of the present disclosure.

DETAILED DESCRIPTION

Figure 1A:
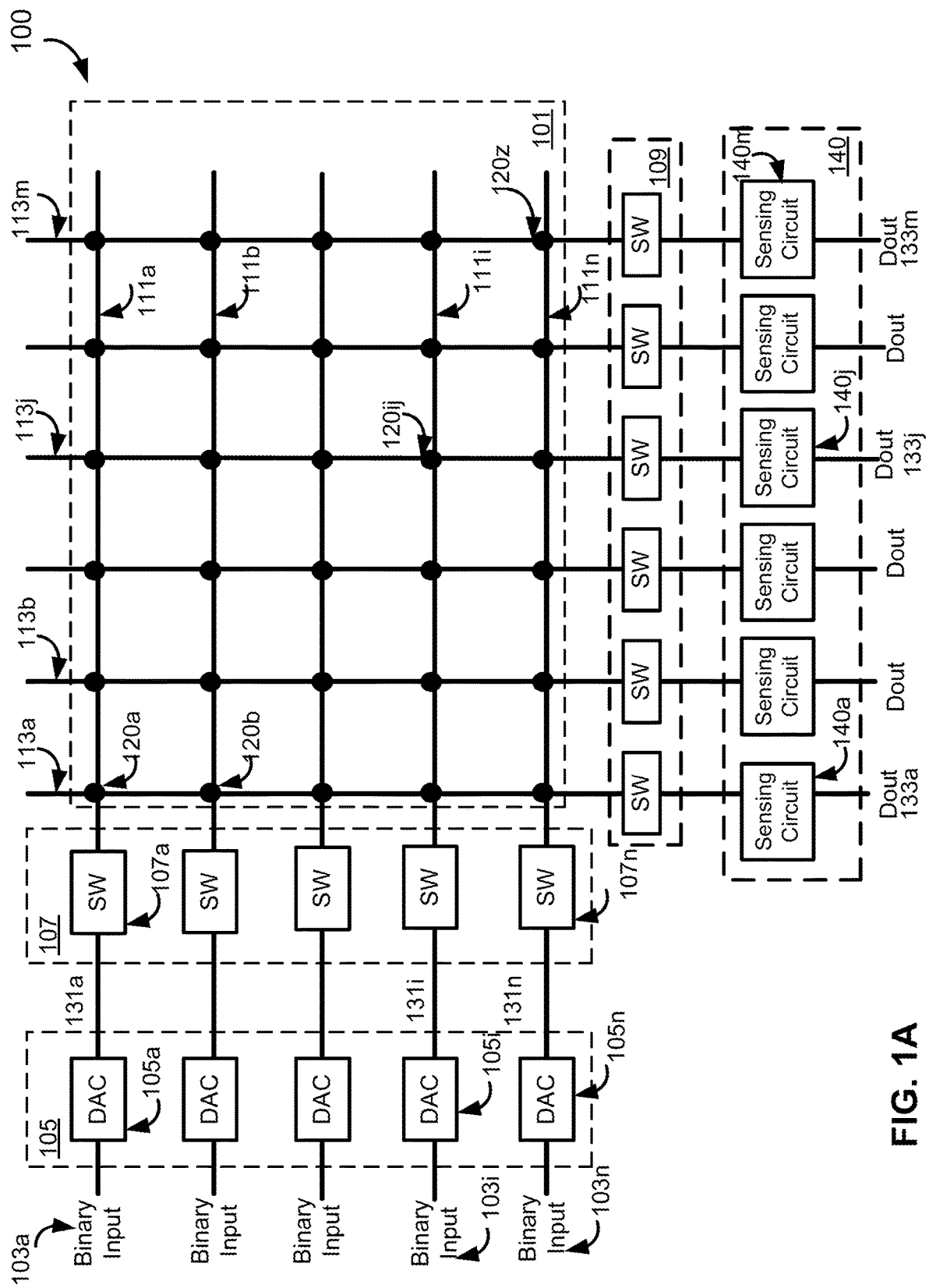
FIG. 1A is a schematic diagram illustrating an example of a crossbar circuit in accordance with some embodiments of the present disclosure.

Aspects of the disclosure provide crossbar circuits and, more specifically, to voltage-based crossbar circuits and methods for performing in-memory computing using the voltage-based crossbar circuits. A crossbar circuit may include intersecting electrically conductive wires (e.g., row lines, column lines, etc.) and cross-point devices arranged in one or more arrays. Each of the cross-point devices may be connected to a row line and a column line. Existing crossbar circuits typically operate in a "current mode" while performing vector matrix multiplication. For example, an input voltage may be applied to each selected row of the current-mode crossbar circuit. The input voltage may flow through the cross-point devices of the row of the crossbar circuit. The conductance of each cross-point device may be tuned to a specific value (also referred to as a "weight"). According to Ohm's law and Kirchhoff's current law, the input-output relationship of the crossbar circuit can be represented as I=VG, wherein I represents the output signal matrix as current; V represents the input signal matrix as voltage; and G represents the conductance matrix of the cross-point devices. As such, the input voltage is weighted at each of the cross-point devices by its conductance according to Ohm's law. The weighted current is output via each column wire and may be accumulated according to Kirchhoff's current law.

The current-mode crossbar circuits typically use a transimpedance amplifier (TIA), integrator, or other current-to-voltage techniques to convert the accumulated current to an analog voltage and then convert the voltage to a digital output. As such, the processing speed of vector matrix multiplication (VMM) by the current-mode crossbar circuits may be limited by the slew rate and bandwidth of the TIA or integrator. Multiple cycles (e.g., n VMM cycles) may be needed to perform VMM operations on a serial-in n-bit binary input and to complete one n-bit input x m-bit weight operation using the current-mode crossbar circuits.

According to one or more aspects of the present disclosure, a voltage-mode crossbar circuit is provided. The voltage-mode crossbar circuit may include a plurality of cross-point devices arranged in one or more arrays and connected to intersecting word lines and bit lines. The crossbar circuit may further include a plurality of sensing circuits connected to the bit lines via a plurality of switches. Each of the sensing circuits may include a voltage amplifying circuit, an analog-to-digital converter (ADC), and/or any other suitable component for sensing bit line voltages on the bit lines and converting the bit line voltages to digital outputs. Performing a VMM operation using the voltage-mode crossbar circuit may involve, for example, selecting an array of cross-point devices and programming the conductance of the selected cross-point devices to conductance values corresponding to the weight matrix. The sensing circuits can be connected or disconnected from the bit lines while performing the VMM operations. A plurality of input voltages may then be applied to the selected cross-point devices via the word lines connected to the selected cross-point devices. The input voltages may be analog signals that are representative of an input vector. Each bit line may have parasitic capacitance that causes charges to be stored on the bit line itself. The voltage stored on the bit line capacitance of each bit line (also referred to as the "bit line voltage") in response to the application of the input voltages may settle to the weighted average of the voltages driven on the word lines, where the weights are the conductance values of cross-point devices. The sensing circuits may be connected to the bit lines to sense and amplify the bit line voltages and convert the amplified bit line voltages into digital outputs.

Unlike the conventional current-mode crossbar circuits, the voltage-mode crossbar circuit described herein does not use an op-amp based circuit, such as a TIA or integrator, to perform in-memory computing. As a result, the settling time of the bit line voltages totally depends on the RC time constant of the weight matrix of the crossbar array and the loading of the sensing circuit, which is not limited by the slew rate or the bandwidth of the op-amps in the TIA or integrator. The op-amp based TIA or integrator usually needs to use large compensation capacitors and bias current, which may consume a large area and extra power. The new architecture is area and power efficient by not using the TIA or integrator. The voltage-mode crossbar circuit may also be more power efficient than the current-mode crossbar circuits and may enable higher computation parallelism.

FIG. 1A is a schematic diagram illustrating an example 100 of a crossbar circuit in accordance with some embodiments of the present disclosure. As shown, crossbar circuit 100 may include a plurality of interconnecting electrically conductive wires, such as word lines (WLs) 111a, 111b, ..., 111i, ..., 111n, and bit lines (BLs) 113a, 113b, ..., 113j, ..., 113m for implementing an n-row by m-column crossbar array 101. The number of BLs 113a-m and the number of WLs 111a-n may or may not be the same. Crossbar circuit 100 may further include cross-point devices 120a, 120b, ..., 120z, etc. Each of the cross-point devices may be connected to a word line and a bit line. For example, cross-point device 120ij may be connected to WL 111i and BL 113j. Each of cross-point devices 120a-z may be and/or include a device with programmable resistance, such as a phase-change memory (PCM) device, floating gate device, spintronic device, resistive random-access memory (RRAM) device, static random-access memory (SRAM), etc. In some embodiments, each cross-point device 120a-z may be and/or include a circuit structure of one-transistor-one-memristor (1T1M), a one-selector-one-resistor (1S1R) structure, a two-resistor (2R) structure, a one-transistor-multiple-memristors structure, etc. In some embodiments, one or more cross-point devices 120a-z may include a cross-point device as described in connection with FIGS. 1B and 1C.

In some embodiments, crossbar circuit 100 may further include one or more digital-to-analog converters (DACs) 105 (e.g., DAC 105a, ..., DAC 105n) that may convert a digital input signal into an analog output signal. Each of DACs 105a, ..., 105i, ..., 105n may receive a binary input 103a, ..., 103i, ..., 103n and may convert the binary input into an analog voltage that may be applied to a respective WL 111a, 111b, ..., 111n as an input voltage (e.g., input voltage 131a, ..., 131i, ..., 131n). Each binary input 101a-n may include one or more bits. In some embodiments, one or more binary input 103a-n may be an N-bit binary input, where N is an integer that is equal to or greater than 1. In some embodiments, each DAC 105a-n may be connected to a WL 111a-n via a switch 107. For example, a switch 107a may connect DAC 105a to WL 111a to activate WL 111a and apply input voltage 131a to WL 111a. As another example, switch 107n may connect DAC 105n to WL 111n to activate WL 111n and apply input voltage 131n to WL 111n. Each DAC 105a-n may include any suitable circuitry for performing digital-to-analog conversion. For example, each DAC 105a-n may be and/or include a resistor-based DAC, a capacitor-based DAC, a current-based DAC, a time-domain DAC, etc. In some embodiments, a driver (not shown) may be connected to one or more DACs 105a-n. In some embodiments, the driver can be integrated with the design of the DAC.

As shown in FIG. 1A, crossbar circuit 100 may further include one or more sensing circuits 140 that may generate digital outputs 133a, ..., 133j, ..., 133m representative of the result of an in-memory computing operation. Sensing circuits 140a, ..., 140j, ..., 140m may be connected to BLs 113a, ..., 113j, ... 113m via switches 109. Performing in-memory computing using crossbar circuit 100 may involve disconnecting sensing circuits 140 from BLs 113a-m and applying input voltages 131a-n to crossbar array 101 during a first processing cycle. Each bit line may have parasitic capacitance (also referred to as the "bit line capacitance") that causes charges to be stored on the bit line itself. The voltage stored on the bit line capacitance of each BL 113a-m (also referred to as the "BL voltage") in response to the application of the input voltages may settle to the weighted average of the voltages driven on the word lines, where the weights are the conductances of cross-point devices 120a-z. The BL voltage on the jth bit line may be determined according to the following equations:

$$\sum i = 1: k((V_i - V_j) \times G_{i\_j}) = 0 \quad (1)$$

$$V_j = \sum i = 1: k(V_i \times G_{i\_j}) / \sum i = 1: k\ G_{i\_j}, \quad (2)$$

In equations 1-2, i represents the index of a row 111a-n; j represents the index of a column 113a-m; G represents the conductance value of the cross-point devices. i=1:k, where k represents the number of WLs activated during the in-memory computing operation.

Unlike a current-mode crossbar circuit, crossbar circuit 100 does not include a TIA or integrator. As a result, the settling time of the bit line voltages mainly depends on the RC time constant of the weight matrix of the memristor array and the loading of the sensing circuit, which is not limited by the slew rate or the bandwidth of the op-amps in the TIA or integrator.

Sensing circuits 140a, ..., 140j, ..., 140m may generate digital outputs (Dout) 133a, ..., 133j, ..., 133m based on the BL voltages. For example, sensing circuits 140 may be connected to BLs 113a-m via switches 109. A sensing circuit 140a, ..., 140j, ..., 140m may sense and amplify the BL voltage on a bit line 113a, ..., 113j, ..., 113m and convert the amplified BL voltages into a digital output 133a, ..., 133j, ..., 133m. In some embodiments, each sensing circuit 140 may include a pre-amplifier that may amplify the BL voltage on a respective BL connected to the pre-amplifier. Each sensing circuit 140 may further include an analog-to-digital converter (ADC) that may convert the output of the pre-amplifiers (e.g., the sensed and/or amplified BL voltage) into a digital signal Dout.

Crossbar circuit 100 may be configured to perform vector-matrix multiplication (VMM) operations. A VMM operation may be represented as Y=XW, wherein each of Y, X, W represents a respective matrix. For example, an input vector X may be mapped to an input voltage V of crossbar circuit 100. A weight matrix W may be mapped to conductance values G of cross-point devices 120a-z. The output voltage may be read and mapped back to output results Y.

For example, performing a VMM operation using crossbar circuit 100 may involve programming cross-point devices 120a-z to suitable conductance values representative of weight matrix W. Sensing circuits 140a, ..., 140m may be connected to or disconnected from BLs 113a, ..., 113m (e.g., by opening switches 109 that may connect sensing circuits 140a-m to BLs 113a-m). One or more input voltages 131a, ..., 131n representative of the matrix X may be applied to one or more cross-point devices via the word lines connected to the cross-point devices. Switches 109 may be closed to connect sensing circuits 140a-m to BLs 113a-m. Sensing circuits 140a, ..., 140m may sense the settled BL voltages on each respective BLs 113a-m and convert the sensed and/or amplified BL voltages into digital outputs 133a, ..., 133j, ..., 133m. The digital outputs may be mapped to matrix Y.

As a more particular example, a weight vector W_i of the weight matrix W may be represented as follows:

$$G\_i = a * W\_i + b, \quad (3)$$

where G_i is the ith column of matrix W.

The ith column of matrix Y may be represented as:

$$Y\_i = X * W\_i. \quad (4)$$

The input vector X may be mapped to an input voltage Vin according to equation (5):

$$Vin = c * X + d, \quad (5)$$

where a, b, c, and d are scalars for mapping coefficients.

Accordingly, the ith column of the bit line voltage may be represented as:

$$VBL\_i = (Vin * G\_i)/\left(\sum(G\_i)\right). \quad (6)$$

And it leads to:

$$VBL\_i = \left(a*c*Y + a*d*\sum W\_i\right) + b*c*\sum(X) + d*b*n\bigg/ \quad (7)$$
$$\left(a*\sum W\_i + b*n\right),$$

where n is the length of X, W_i, Vin, and G_i.

The digital outputs may be read and mapped back to output results Y according to equations (8)-(10).

$$Y\_i = p1 * VBL\_i + p2 + p3, \text{ where } p1 = \left(a*\sum W\_i + b*n\right)/(a*c), \quad (8)$$

$$p2 = -d/c * \sum W\_i - d*b*n/(a*c), \quad (9)$$

$$p3 = -b/a * \sum X. \quad (10)$$

In some embodiments, the values of p1 and p2 may be pre-calculated before performing the VMM operations, while p3 may be calculated per inference. p3 may be ignored if b=0.

In some embodiments, VBL_i may be sensed by a K-bit ADC with differential voltage references VADC_High and VADC_Low. The least significant bit (LSB) of the ADC may be determined as follows:

$$VADC\_LSB = (VADC\_HIGH - VADC\_LOW)/(2^{\wedge}K - 1). \quad (11)$$

Accordingly, the output of the ADC may be:

$$ADC\_out = round((VBL\_i - VADC\_LOW)/VADC\_LSB). \quad (12)$$

Equation (7) may be rewritten as follows:

$$VBL\_i = ADC\_out * VADC\_LSB + VADC\_LOW. \quad (13)$$

Accordingly, equation (8) may be rewritten as follows:

$$Y\_i = p1\_b * ADC\_out + p2\_b + p3\_b, \quad (14)$$

$$\text{where } p1\_b = p1 * VADC\_LSB; \quad (15)$$

$$p2\_b = p2 + p1 * VADC\_LOW; \quad (16)$$

$$p3\_b = p3. \quad (17)$$

Figure 1B:
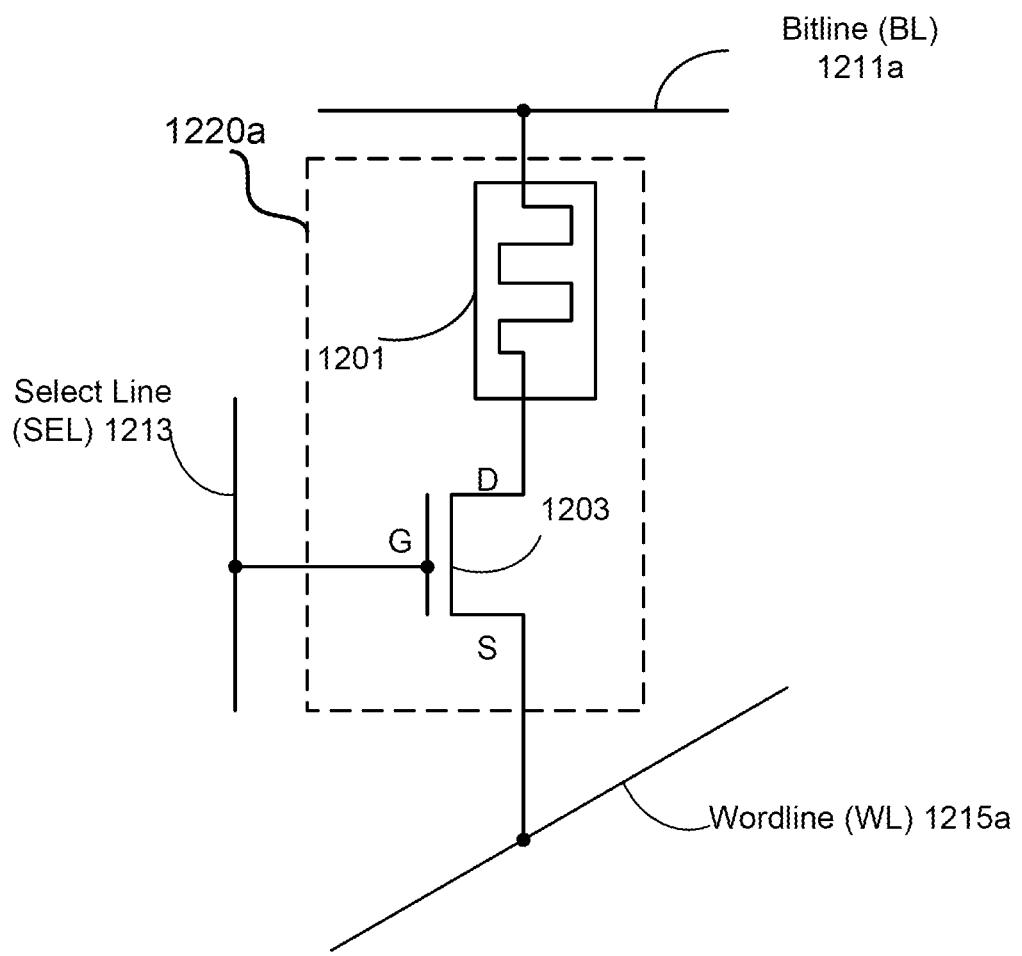
FIGS. 1B and 1C are schematic diagrams illustrating example cross-point devices in accordance with some embodiments of the present disclosure.
Figure 1C:
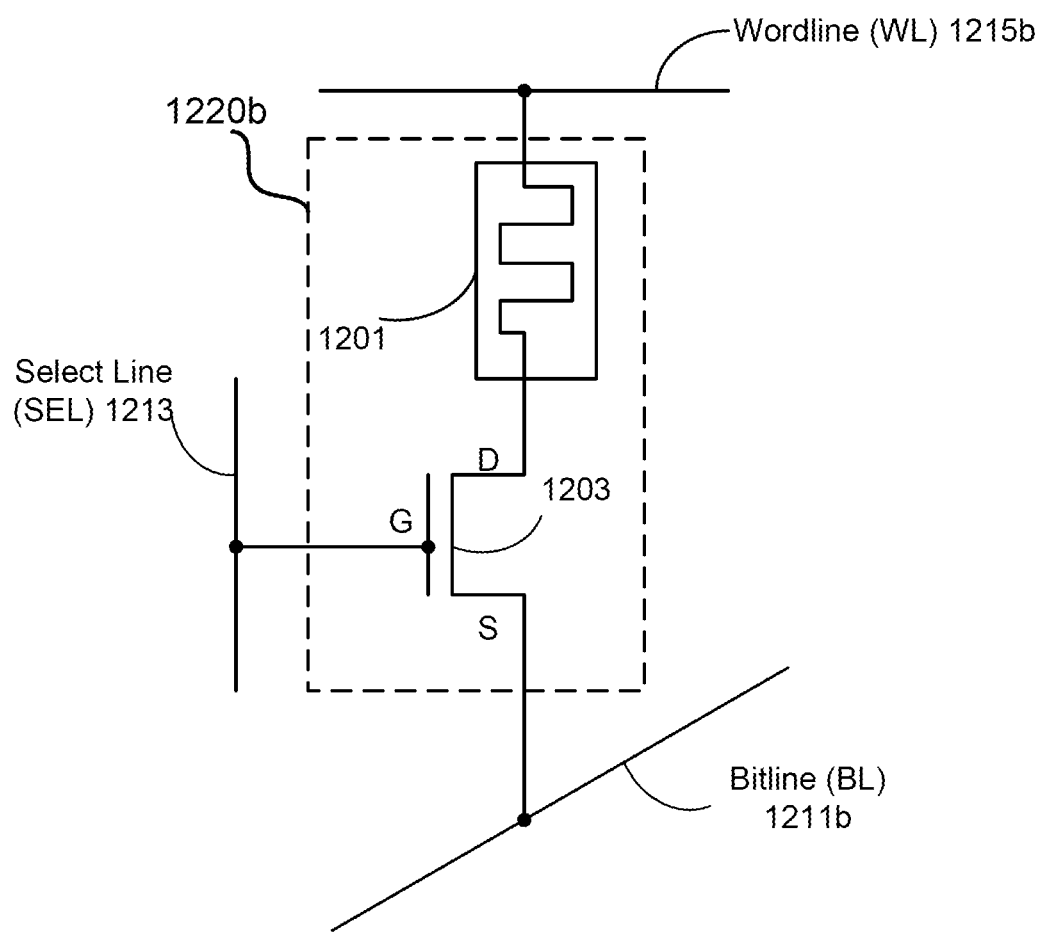

FIGS. 1B and 1C are schematic diagrams illustrating example cross-point devices 1220*a* and 1220*b* in accordance with some embodiments of the present disclosure. Each of cross-point devices 1220*a* and 1220*b* may be referred to as a 1-transistor-1-resistor (1T1R) configuration.

As shown in FIGS. 1B and 1C, a cross-point device 1220*a-b* may include an RRAM device 1201 and a transistor 1203 that are connected in series. A transistor may include three terminals that may be marked as gate (G), source (S), and drain (D), respectively. Referring to FIG. 1B, a first terminal of RRAM device 1201 may be connected to the drain of transistor 1203. A second terminal of RRAM device 1201 may be connected to a bit line 1211*a*. The source of the transistor 1203 may be connected to a word line 1215*a*. The gate of transistor 1203 may be connected to a select line 1213.

As shown in FIG. 1C, the second terminal of RRAM device 1201 may be connected to a word line 1215*b*, and the source of the transistor 1203 may be connected to a bit line 1211*b* in some embodiments.

Figure 2A:
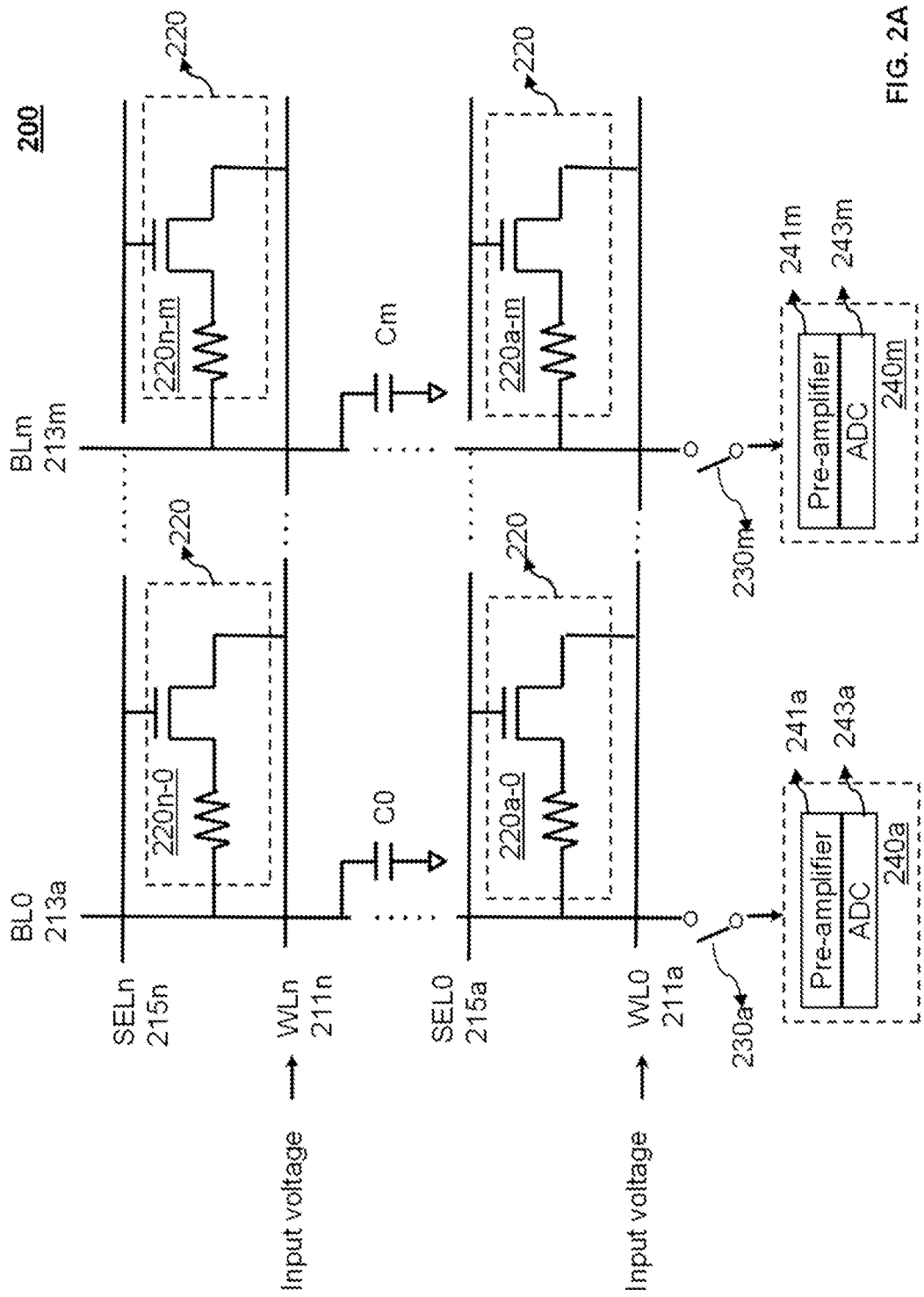
FIG. 2A is a schematic diagram illustrating an example of a crossbar circuit in accordance with some embodiments of the present disclosure.
Figure 3:
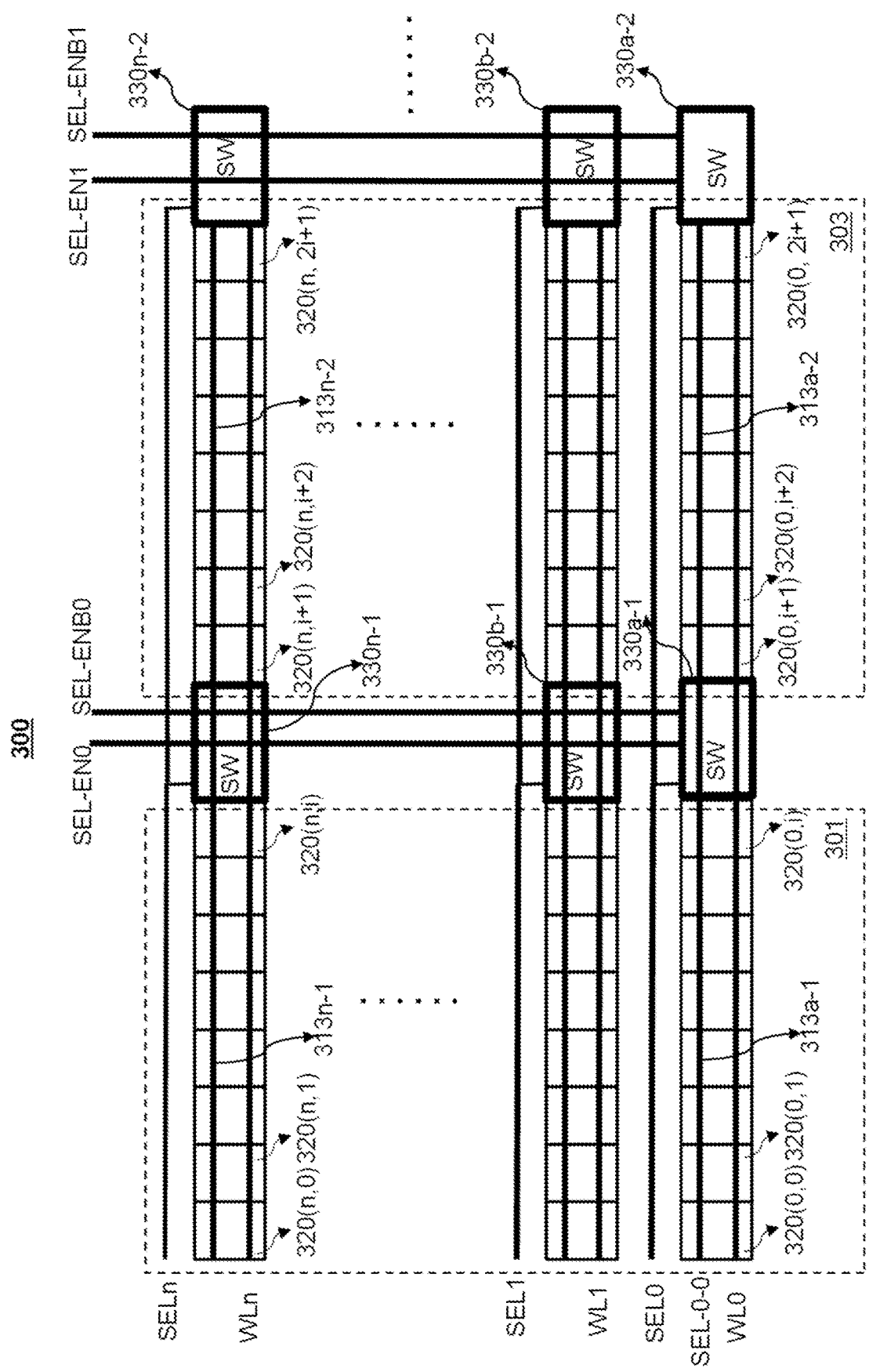
FIG. 3 is a schematic diagram illustrating an example of an individual bank control scheme in accordance with some embodiments of the present disclosure.

Word line 1215 may correspond to a word line 111*a-n* of FIG. 1A, a word line 211*a-n* of FIG. 2A, and/or a word line WL0-n of FIG. 3. Bit line 1211 may correspond to a bit line 123*a-m* of FIG. 1A and/or a bit line 213*a-m* of FIG. 2A. Select line 1213 may correspond to a select line 215*a-n* of FIG. 2A or a local select line 313*a-n* of FIG. 3.

Transistor 1203 may function as a selector as well as a current controller and may set the current compliance to RRAM device 1201 during programming. The gate voltage on transistor 1203 can set current compliances to cross-point device 1220 during programming and can thus control the conductance and analog behavior of cross-point device 1220. For example, when cross-point device 1220 is set from a high-resistance state to a low-resistance state, a set signal (e.g., a voltage signal, a current signal) may be provided via bit line (BL) 1211 or word line (WL) 1215. Another voltage, also referred as a select voltage or gate voltage, may be applied via select line (SEL) 1213 to the transistor gate to open the gate and set the current compliance, while word line (WL) 1215 or bit line (BL) may be grounded. When cross-point device 1220 is reset from the low-resistance state to the high-resistance state, a gate voltage may be applied to the gate of transistor 1203 via select line 1213 to open the transistor gate. Meanwhile, a reset signal may be sent to RRAM device 1201 via word line 1215 or bit line 1213, while bit line 1213 or word line 1215 may be grounded.

Figure 2B:
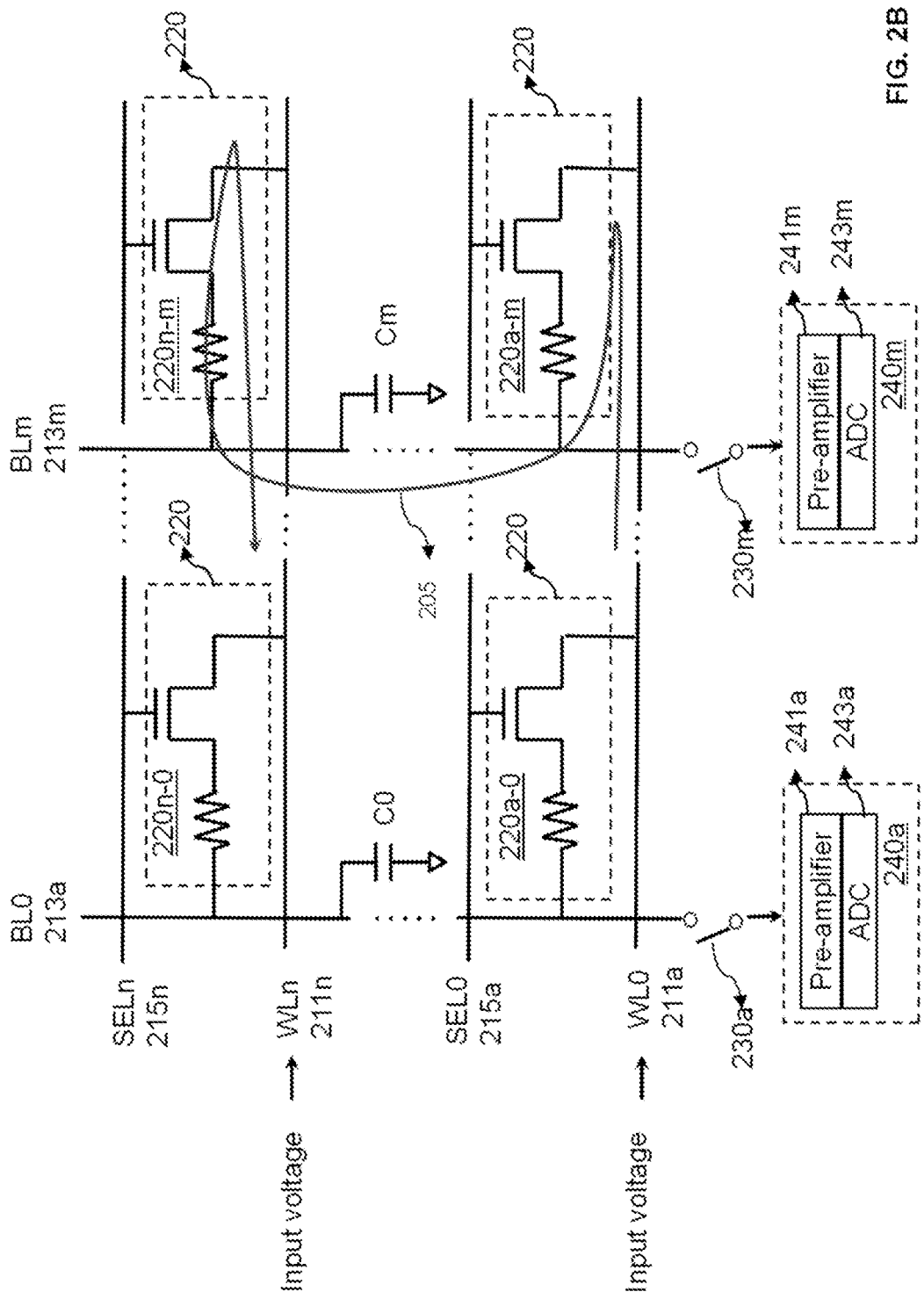
FIG. 2B is a schematic diagram illustrating an example undesired current path that may present in a crossbar circuit in some embodiments.

FIG. 2A is a schematic diagram illustrating an example 200 of a crossbar circuit in accordance with some embodiments of the present disclosure. Crossbar circuit 200 is an example of crossbar circuit 100 of FIG. 1A in greater detail. FIG. 2B is a schematic diagram illustrating an example undesired current path 205 that may present in crossbar circuit 200 in some embodiments.

Crossbar circuit 200 may include word lines (WL0, ..., WLn) 211*a*, ..., 211*n*, bit lines 213*a-m* (BL0, ..., BLm), cross-point devices 220, and select lines 215a-n (SEL0, ..., SELn). Each bit line BL0, ..., BLm may be connected to a sensing circuit 240a, ..., 240m via a switch 230a, ..., 230m. Each sensing circuit 240a, ..., 240m may include a pre-amplifier 241a, ..., 241m and an ADC 243a, ..., 243m. Each bit line may have parasitic capacitance that causes charges to be stored on the bit line itself. In FIG. 2A, the parasitic capacitances of BL0 and BLm are represented as C0 and Cm, respectively. Word lines 211a-n and bit lines 213a-m may be the same as word lines 111a-n and bit lines 113a-m of FIG. 1, respectively. As shown in FIG. 2A, select lines 215a-n may be parallel to word lines 211a-n.

As shown, each cross-point device 220 may be connected to a bit line (BL) 213a-m, a select line (SEL) 215a-n, and a word line (WL) 211a-n. In some embodiments, each cross-point device 220 may include a transistor and an RRAM device connected in series (e.g., a 1T1R configuration described in connection with FIG. 1). For example, the first terminal of the RRAM device may be connected to the drain of the transistor. A second terminal of RRAM device 220 may be connected to bit line 211. The source of the transistor may be connected to a word line. The gate of the transistor may be connected to a select line 215a-n.

Performing in-memory computing using crossbar circuit 200 may involve selecting one or more cross-point devices 220 by applying a suitable select voltage to one or more select lines 215a-n connected to the cross-point devices 220 to be selected. The conductance of the selected cross-point devices may then be programmed to suitable values (e.g., conductance values corresponding to a weight matrix W). Sensing circuits 240a-m may be connected to or disconnected from the bit lines BL0-BLm (e.g., by closing or opening switches 230a-m). Input voltages may then be applied to the selected cross-point devices via the word lines connected to the selected cross-point devices. After the bit line voltages are settled on bit lines BL0-m, sensing circuits 240a-m may be connected to bit lines BL0-m. Pre-amplifier 241a-m may sense and amplify the bit line voltage settled on a respective bit line BL0-m. ADC 243a-m may convert the amplified bit line voltage into a digital output.

In a crossbar circuit utilizing the 1T1R configuration, the gate selection can only be controlled from one direction (e.g., a horizontal direction or a vertical direction). There may be undesired current paths through the unselected bit lines. For example, when BL0 is selected and BLm is unselected, an undesired current path that flows from 220a-m to 220n-m via unselected bit line BLm (as shown in current path 205 in FIG. 2B) may cause input-dependent VMM errors and extra power consumption. This issue can be solved utilizing an individual bank control scheme as discussed in further detail in connection with FIG. 3. In particular, each cross-point device 220 may be further connected to a local select line that may control and/or enable a group of cross-point devices connected to one or more bit lines (1 bit line, 8 bit lines, 16 bit lines, etc.). A cross-point device may be selected and enabled when both the global select line and the local select line connected to the cross-point device are enabled.

FIG. 3 is a schematic diagram 300 illustrating an example of an individual bank control scheme in accordance with some embodiments of the present disclosure. The individual control scheme may be used to reduce and/or eliminate undesired current paths in a voltage-based crossbar circuit as described herein.

As shown, cross-point devices 320 (represented as squares in diagram 300) are arranged in arrays and connected to word lines WL0, WL1, ..., WLn and global select lines SEL0, SEL1, ..., SELn. Each cross-point device 320 may be a cross-point device 120a-z of FIG. 1A and/or cross-point device 220 of FIG. 2A. The word lines WL0, WL1, ..., WLn as shown in FIG. 1A may correspond to WLs 111a-n of FIG. 1A and/or WLs 211a-n of FIG. 2A.

A cross-point device 320(n, i) is connected to the nth word line WLn and the ith bit line BLi (not shown in FIG. 3). For example, cross-point devices 320(n, 0), 320(n, 1), ..., 320(n, i) are connected to the nth word line WLn and are connected to bit lines BL0, BL1, ..., BLi (not shown in FIG. 3), respectively. As another example, cross-point devices 320(0, 0), 320(0, 1), ..., 320(0, i) are connected to the first word line WL0 and are connected to bit lines BL0, BL1, ..., BLi, respectively.

Cross-point devices 320 may be divided into multiple logical groups (also referred to as "banks"). Each logical group or bank may include an array of cross-point devices connected to one or more particular bit lines. For example, a first bank 301 may include the cross-point devices that are connected to bit lines BL0, BL1, ..., BLi and word lines WL0-WLn, such as cross-point devices 320(n, 0), 320(n, 1), ..., 320(n, i), ..., 320(0, 0), 320(0, 1), ..., and 320(0, i). A second bank 303 may include the cross-point devices that are connected to bit lines BLi+1, BLi+2, ..., BL2i+1 (not shown in FIG. 3) and word lines WL0-WLn, such as cross-point devices 320(n, i+1), 320(n, i+2), ..., 320(n, 2i+1), ..., 320(0, i+1), 320(0, i+2), ..., 320(0, 2i+1). Each bank may include an array of any suitable number of cross-point devices that may be connected to a suitable number of bit lines (e.g., 8 bit lines, 16 bit lines, 32 bit lines, etc.). A crossbar circuit as described herein may be divided into any suitable number of banks to achieve desirable processing granularity, speed, and/or chip density. While two banks are shown in FIG. 3 for simplicity, this is merely illustrative. The individual bank control scheme described herein may be implemented using any suitable number of banks.

A shown in FIG. 3, each global select line SEL0, SEL1, ..., SELn may be connected to a plurality of local select lines 313a-1, 313a-2, ..., 313n-1, 313n-2, etc. via a plurality of switches SW (e.g., switches 330a-1, 330a-2, ..., 330b-1, 330b-2, ..., 330n-1, 330n-2, etc.). For example, global select line SELn and local select line 313n-1 may be connected through a switch 330n-1. Global select line SELn and local select line 313n-2 may be connected through a switch 330n-2. Global select line SEL0 and local select line 313a-1 may be connected through a switch 330a-1. Global select line SEL0 and a local select line 313a-2 may be connected through a switch 330a-2. Each of the switches may be and/or include a switch 400a, 400b, and/or 400c of FIGS. 4A-4C or any other suitable circuitry for selectively connecting a local select line to a global select line as described herein.

In response to the application of one or more enabling signals, a switch SW may connect the local select line to the global select line that is connected to the switch SW. A cross-point device connected to the local select line may then be selected and enabled by applying a select voltage to the global select line. For example, switch 330n-1 may connect global select line SELn and local select line 313n-1 in response to the application of a first enable signal SEL_EN0 and/or a second enable signal SEL_ENB0. Cross-point devices 320(n, 0), 320(n, 1), ..., 320(n, i) may then be selected and/or enabled by applying a suitable select voltage to global select line SELn. In some embodiments, the second enable signal SEL_ENB0 may be the negation of the first enable signal SEL_EN0. In one implementation, switch 330n-1 may be enabled by connecting SEL_EN0 and SEL_ENB0 to a high voltage and a low voltage, respectively. In another implementation, switch 330n-1 may be deactivated by connecting SEL_EN0 and SEL_ENB0 to a low voltage and a high voltage, respectively. As another example, switch 330n-2 may be enabled by setting SEL_EN1 and SEL_ENB1 to a high voltage and a low voltage, respectively. In some embodiments, switch 330n-2 may be deactivated by setting SEL_EN1 and SEL_ENB1 to a low voltage and a high voltage, respectively.

In some embodiments, the switches associated with a bank of the crossbar circuit may be connected to and/or controlled by the same enable signal(s). For example, switches 330a-1, 330b-1, . . . , 330n-1 may be controlled by the first enable signal SEL_EN0 and/or the second enable signal SEL_ENB0. First bank 301 may be enabled or deactivated in response to the application of the first enable signal SEL_EN0 and/or the second enable signal SEL_ENB0 to switches 330a-1, 330b-1, . . . , 330n-1 that control first bank 301. In one implementation, first bank 301 may be enabled by setting SEL_EN0 and SEL_ENB0 to a high voltage and a low voltage, respectively. When first bank 301 is enabled, each of the local select lines in first bank 301 (e.g., local select lines 313a-1, . . . , 313n-1) may be connected to a respectively global select line SEL0-SELn. One or more cross-point devices in first bank 301 (e.g., cross-point devices 320(0, 0), 320(0, 1), . . . , 320(0, i), . . . , 320(n, 0), 320(n, 1), . . . , and 320(n, i)) may then be selected and/or enabled by applying a suitable select voltage to one or more global select lines SEL0-SELn corresponding to the cross-point devices. In some embodiments, first bank 301 may be deactivated by setting SEL_EN0 and SEL_ENB0 to a low voltage and a high voltage, respectively. When first bank 301 is deactivated, each of the local select lines in bank 301 may be disconnected from the respective global select line SEL0-SELn. Similarly, second bank 303 may be enabled or deactivated in response to the application of the third enable signal SEL_EN1 and/or the fourth enable signal SEL_ENB1 to one or more switches SW that controls second bank 303.

A cross-point device may be selected and enabled by enabling the bank in which the cross-point device is located and the global select line connected to the cross-point device. For example, cross-point devices 320(n, 0), 320(n, 1) . . . , and 320(n, i) may be selected and enabled by enabling first bank 301 and applying a suitable select voltage to the global select line SELn. The cross-point devices in a bank of the crossbar circuit may be selected to perform an i×n VMM operation. For example, the cross-point devices in first bank 301 (e.g., cross-point devices 320(0, 0), 320(0, 1) . . . , 320(0, i), . . . , 320(n, 0), 320(n, 1), . . . , 320(n, i)) may be selected by enabling first bank 301 and applying a suitable select voltage to each of global select lines SEL0, . . . , SELn. While first bank 301 is enabled, the other banks (e.g., bank 303, etc.) in the crossbar circuit may be deactivated so that the cross-point devices in those banks are not selected for performing the VMM operation. For example, second bank 303 may be deactivated and the cross-point devices in second bank 303 (e.g., cross-point devices 320(0, 0), 320(0, 1) . . . , 320(0, i), . . . , 320(n, 0), 320(n, 1), . . . , 320(n, i)) may be unselected by disconnecting each of local select lines 313a-2, . . . , 313n-2 from a respective global select line SEL0, . . . , SELn via switches 330a-2, 330b-2, . . . , 330n-2. As a further example, first bank 301 and second bank 303 may be enabled to perform an n×(2i+1) VMM operation. More particularly, for example, the cross-point devices in first bank 301 and second bank 303 may be selected by enabling first bank 301 and second bank 303 and applying a suitable select voltage to each of global select lines SEL0, . . . , SELn.

Figure 4A:
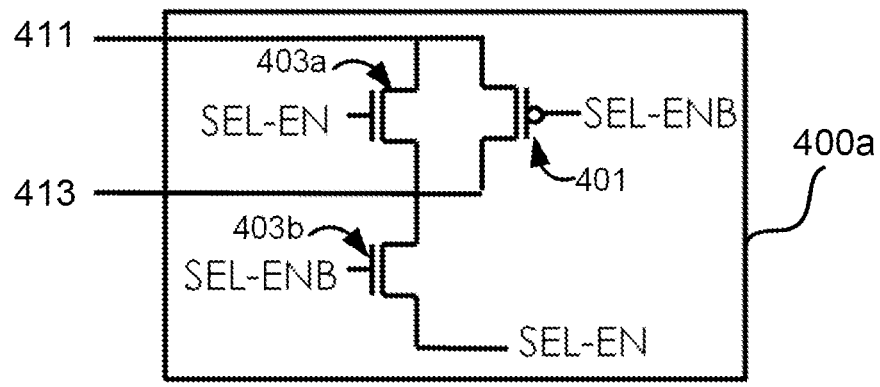
FIGS. 4A, 4B, and 4C are schematic diagrams illustrating example switches in accordance with some embodiments of the present disclosure.
Figure 4B:
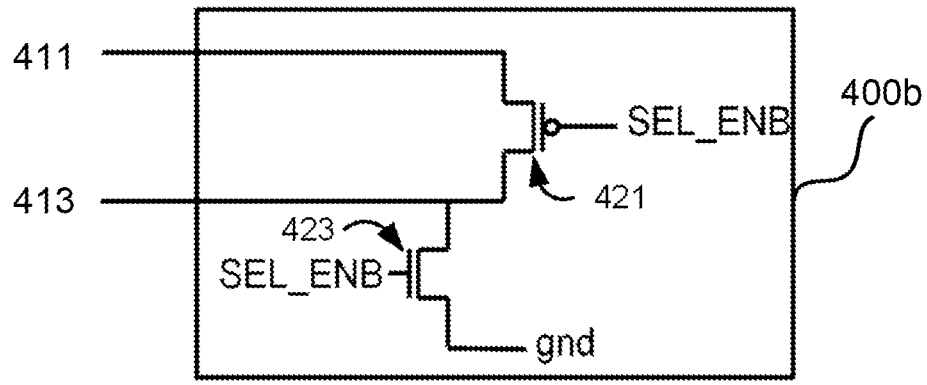
Figure 4C:
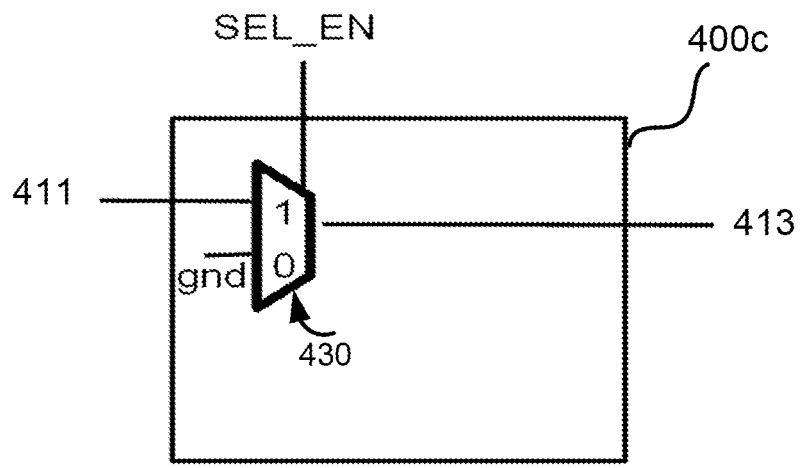

FIGS. 4A, 4B, and 4C are schematic diagrams illustrating example switches in accordance with some embodiments of the present disclosure.

As shown in FIG. 4A, a switch 400a may include a PMOS transistor 401 and NMOS transistors 403a and 403b. Switch 400a may be connected to a global select line 411 and a local select line 413. Global select line 411 may correspond to a global select line SEL0-SELn as described in connection with FIG. 3. Local select line 413 may correspond to a local select line 313a-1, 313a-2, etc. as described in connection with FIG. 3. Switch 400a may be controlled by enabling signals SEL_EN and/or SEL_ENB. SEL_ENB may be the negation of SEL_EN in some embodiments. SEL_EN may correspond to enable signals SEL_EN0, SEL_EN1, etc. as described in connection with FIG. 3. SEL_ENB may correspond to enable signals SEL_ENB0, SEL_ENB1, etc. as described in connection with FIG. 3.

Each PMOS transistor 401 and NMOS transistors 403a-b may function as a voltage-controlled switch. In particular, PMOS transistor 401 may be activated by a low voltage (a logic-low voltage) and NMOS transistor 403a-b may be activated by a high voltage (a logic-high voltage). For example, PMOS transistor 401 may be activated by setting enable signals SEL_EN and SEL_ENB to a high voltage and a low voltage, respectively. Local select line 413 may be connected to global select line 411 when PMOS transistor 401 is activated. When enable signals SEL_EN and SEL_ENB are set to a low voltage and a high voltage, respectively, local select line 413 is connected to the low voltage and disconnected from global select line 411.

In some embodiments in which the threshold voltage drop for high voltage on the drain may be tolerated, a single NMOS may function as a switch.

In some embodiments, the select voltage to be applied to global select line 411 may be generally greater than the threshold voltage of the PMOS transistor. A switch 400b as illustrated in FIG. 4B may be used to implement the individual bank control scheme as described herein. As shown, switch 400b may include a PMOS transistor 421 and an NMOS transistor 423. When the enable signal SEL_ENB is set to a low voltage, PMOS transistor 421 may be activated and global select line 411 may be connected to local select line 413. When the enable signal SEL_ENB is set to a high voltage, PMOS transistor 421 may be deactivated. As a result, local select line 413 is grounded and disconnected from global select line 411.

Referring to FIG. 4C, switch 400c may include a digital gate 430 that may selectively connect global select line 411 to local select line 413 in view of a digital enable signal SEL_EN. Digital gate 430 may connect local select line 413 to global select line 411 while a high voltage SEL_EN is applied to digital gate 430. Local select line 413 may be grounded when SEL-EN is a low voltage.

FIG. 5 is a flowchart of an example method 500 for performing in-memory computing using a crossbar circuit in accordance with some embodiments of the present disclosure.

At step 510, a first plurality of cross-point devices of a crossbar circuit may be selected. The first plurality of cross-point devices may be connected to one or more first bit lines and one or more first word lines intersecting with the one or more first bit lines. For example, the first plurality of cross-point devices may be cross-point devices 320(n, 0), 320(n, 1), . . . , 320(n, i) that are connected to a word line WLn of FIG. 3 and a plurality of bit lines BL0-BLi. The first plurality of cross-point devices may further be connected to a local select line (e.g., local select line 313n-1 of FIG. 3). Selecting the first plurality of cross-point devices may involve connecting the local select line to a global select line (e.g., global select line SELn of FIG. 3) by applying a suitable select voltage to the global select line. While the first plurality of cross-point devices is selected for performing in-memory computing, one or more other cross-point devices of the crossbar circuit may be unselected. For example, a second plurality of cross-point devices (e.g., cross-point devices 320(n, i+1), 320(n, i+2), . . . , 320(n, 2i+1) of FIG. 3) may be unselected by disconnecting a second local bit line associated with the second plurality of cross-point devices from the global select line. The second plurality of cross-point devices and the first plurality of cross-point devices may be connected to the same word line but connected to different bit lines. For example, the first plurality of cross-point devices and the second plurality of cross-point devices may be connected to the same word line WLn. The first plurality of cross-point devices may be connected to one or more first bit lines (e.g., BL0, . . . , BLi), while the second plurality of cross-point devices may be connected to one or more second bit lines (e.g., BLi+1, . . . , BL2i+1). Disconnecting the second local select line from the global select line may involve applying a second enable voltage to a second switch connecting the second local select line and the global select line.

In some embodiments, the first plurality of cross-point devices may be a first array of cross-point devices in a first bank of the crossbar circuit. Selecting the first plurality of cross-point devices may involve enabling the first bank (e.g., by applying one or more suitable enable signals to one or more switches that connect the local select lines to the global select lines) and applying a select voltage to the global select lines. The second plurality of cross-point devices may be a second array of cross-point devices in a second bank of the crossbar circuit. Unselecting the second plurality of cross-point devices may involve deactivating the second bank including the second plurality of cross-point devices.

At step 520, the conductance of the selected cross-point devices may be programmed to conductance values corresponding to a weight matrix. The weight matrix may be the matrix W described in connection with FIG. 1A and equations 1-17. Programming a cross-point device may involve a suitable programming voltage to the cross-point device as described in connection with FIGS. 1B and 1C.

At step 530, a plurality of input voltages may be applied to the first plurality of cross-point devices via the word lines. In some embodiments, the input voltages may be generated by one or more DACs that may convert binary inputs into the input voltages. The input voltages may correspond to an input vector Vin as described in connection with equations 1-17.

At step 540, bit line voltages on the bit lines may be sensed and/or amplified using a plurality of sensing circuits. Each of the bit line voltages corresponds to a voltage accumulated on the bit line capacitance of each of the bit lines in response to an application of the plurality of input voltages to the first plurality of cross-point devices. For example, the bit lines may be connected to the sensing circuits. The sensing circuits may then sense and/or amplify the bit line voltages (e.g., using a pre-amplifier and/or any other suitable circuitry that may amplify the bit line voltages).

At step 550, a plurality of digital outputs may be generated based on the amplified bit line voltages. The digital outputs may represent the BL voltages on the plurality of bit lines in response to an application of the plurality of input voltages to the first plurality of cross-point devices. In some embodiments, the digital outputs may be generated by performing analog-to-digital conversion on the amplified BL voltages.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
   a plurality of bit lines intersecting with a plurality of word lines;
   a plurality of cross-point devices, wherein each of the plurality of cross-point devices is connected to at least one of the plurality of word lines and at least one of the plurality of bit lines, and wherein each of the plurality of cross-point devices comprises a resistive random-access memory (RRAM) device; and
   a plurality of sensing circuits configured to:
      amplify a plurality of bit line voltages settled on the plurality of bit lines in response to an application of a plurality of input voltages to the plurality of cross-point devices via the plurality of word lines; and
      generate a plurality of digital outputs representative of the amplified bit line voltages.

2. The apparatus of claim 1, wherein a first sensing circuit of the plurality of sensing circuits comprises a first pre-amplifier that amplifies a first bit line voltage on a first bit line.

3. The apparatus of claim 2, wherein the first sensing circuit further comprises an analog-to-digital converter (ADC) configured to generate a first output voltage based on an output of the first pre-amplifier.

4. The apparatus of claim 2, further comprising a plurality of digital-to-analog converters (DACs) configured to convert one or more binary inputs into the plurality of input voltages.

5. The apparatus of claim 4, wherein a first binary input of the one or more binary inputs comprises a plurality of bits.

6. The apparatus of claim 1, further comprising:
   a first local select line connected to a first plurality of cross-point devices;
   a second local select line connected to a second plurality of cross-point devices, wherein the first plurality of cross-point devices and the second plurality of cross-point devices are connected to one or more first word lines of the plurality of word lines, wherein the first plurality of cross-point devices is connected to one or more first bit lines of the bit lines, and wherein the second plurality of cross-point devices is connected to one or more second bit lines of the plurality of bit lines;
   a first switch connected to the first local select line and a first global select line; and
   a second switch connected to the second local select line and the first global select line.

7. The apparatus of claim 6, wherein the first global select line is parallel to the plurality of word lines.

8. The apparatus of claim 7, wherein the first local select line is connected to the first global select line via the first switch in response to an application of a first enable signal to the first switch.

9. The apparatus of claim 8, wherein the first local select line is disconnected from the first global select line via the first switch in response to an application of a second enable signal to the first switch.

10. The apparatus of claim 8, wherein a third local select line is connected to a third plurality of cross-point devices, wherein the third plurality of cross-point devices is connected to the one or more first bit lines of the plurality of bit lines and a second word line, and wherein a third switch is connected to the third local select line and a second global select line.

11. A method for performing in-memory computing, comprising:
    selecting a first plurality of cross-point devices of a crossbar circuit, wherein the first plurality of cross-point devices is connected to one or more first bit lines and one or more first word lines intersecting with the one or more first bit lines;
    providing a plurality of input voltages to the first plurality of cross-point devices via the one or more first word lines;
    amplifying, using a plurality of sensing circuits, bit line voltages settled on the one or more first bit lines in response to an application of the plurality of input voltages to the first plurality of cross-point devices; and
    generating a plurality of digital outputs based on the amplified bit line voltages.

12. The method of claim 11, wherein providing the plurality of input voltages comprises generating the plurality of input voltages using a plurality of digital-to-analog converters (DACs).

13. The method of claim 11, wherein the plurality of sensing circuits is disconnected from the one or more bit lines while the plurality of input voltages is provided to the first plurality of cross-point devices via the one or more first word lines.

14. The method of claim 11, wherein generating the plurality of digital outputs based on the amplified bit line voltages comprises performing analog-to-digital conversion on the amplified bit line voltages.

15. The method of claim 11, wherein selecting the first plurality of cross-point devices comprises:
    connecting a first local select line to a first global select line, wherein the first plurality of cross-point devices of the crossbar circuit is connected to the first local select line; and
    applying a select voltage to the first global select line.

16. The method of claim 15, wherein connecting the first local select line to the first global select line comprises applying a first enable voltage to a first switch that is connected to the first local select line and the first global select line.

17. The method of claim 16, wherein selecting the first plurality of cross-point devices of the crossbar circuit further comprises:
    disconnecting a second local select line from the first global select line, wherein the second local select line is connected to a second plurality of cross-point devices, wherein the second plurality of cross-point devices is connected to the one or more first word lines and one or more second bit lines.

18. The method of claim 17, wherein disconnecting the second local select line from the first global select line comprises:
applying a second enable voltage to a second switch connecting the second local select line and the first global select line.

19. The method of claim 15, wherein selecting the first plurality of cross-point devices of the crossbar circuit comprises:
activating an array of cross-point devices by connecting each local select line of a plurality of local select lines to one of a plurality of global select lines, wherein the array of cross-point devices comprises the first plurality of cross-point devices.

20. The method of claim 19, wherein connecting each local select line of the plurality of local select lines to one of the plurality of global select lines comprises applying an enable voltage to a plurality of switches connected to the plurality of local select lines.

* * * * *